United States Patent [19]

Loerzer et al.

[11] Patent Number: 5,593,811
[45] Date of Patent: Jan. 14, 1997

[54] MULTILAYER, SHEET-LIKE, PHOTOSENSITIVE RECORDING MATERIAL FOR THE PRODUCTION OF PRINTING PLATES

[75] Inventors: Thomas Loerzer, Neustadt; Stefan Wegener, Saulheim; Friedrich Goffing, Limburgerhof, all of Germany

[73] Assignee: BASF Lacke+Farben Aktiengesellschaft, Munich, Germany

[21] Appl. No.: 576,770

[22] Filed: Dec. 21, 1995

[30] Foreign Application Priority Data

Dec. 23, 1994 [DE] Germany .......................... 44 46 196.8

[51] Int. Cl.⁶ .......................... G03C 11/12; G03C 1/805; G03C 1/85; G03F 7/30
[52] U.S. Cl. .......................... 430/258; 430/259; 430/262; 430/263; 430/271.1; 430/306; 430/530
[58] Field of Search .......................... 430/262, 263, 430/259, 258, 530, 271.1, 306

[56] References Cited

U.S. PATENT DOCUMENTS

| | | | |
|---|---|---|---|
| 3,884,693 | 5/1975 | Bauer et al. | 96/15 |
| 4,072,525 | 2/1978 | Inouye et al. | 96/100 |
| 4,072,527 | 2/1978 | Fan | 96/35.1 |
| 5,035,981 | 7/1991 | Kurtz et al. | 430/262 |
| 5,093,168 | 3/1992 | Suzuki et al. | 430/262 |
| 5,294,516 | 3/1994 | Sato et al. | 430/262 |

FOREIGN PATENT DOCUMENTS 2823300  12/1979  Germany .

*Primary Examiner*—Richard L. Schilling
*Attorney, Agent, or Firm*—Keil & Weinkauf

[57] ABSTRACT

(A) being a photosensitive relief-forming layer in which imagewise exposure to actinic light results in different solubilities of the exposed and unexposed parts, and this layer consists of a mixture of:

(a1) one or more polymeric binders, (a2) one or more photopolymerization initiators, (a3) one or more organic compounds which are compatible with the binder (a1) and contain photopolymerizable olefinically unsaturated groups and, if required, (a4) one or more assistants, (B) being a smooth or dull, nontacky release layer (B) which is transparent to light, soluble or swellable in the relevant liquid media and formed by a polymer forming strong films and additives contained therein, and (C) being a cover sheet which can be detached from the release layer (B), the release layer (B) containing a metal salt as an additive,
is suitable for the production of printing plates.

4 Claims, No Drawings

MULTILAYER, SHEET-LIKE, PHOTOSENSITIVE RECORDING MATERIAL FOR THE PRODUCTION OF PRINTING PLATES

Multilayer, sheet-like, photosensitive recording material for the production of printing plates The present invention relates to a multilayer, sheet-like, photosensitive recording material which is suitable for the production of photopolymerized letterpress, gravure printing, flexographic printing and relief plates and which contains the layers (A), (B) and (C) in the stated order one on top of the other, (A) being a photosensitive relief, forming layer in which imagewise exposure to actinic light results in a difference between the solubilities of the exposed and unexposed parts, so that the layer can be developed with organic, aqueous alcoholic, aqueous alkaline or aqueous liquid media, and this layer consisting of, based on its total amount, a mixture of:

(a1) from 20 to 98.999% by weight of one or more polymeric binders, (a2) from 0.001 to 10% by weight of one or more photopolymerization initiators, (a3) from 1 to 60% by weight of one or more organic compounds which are compatible with the binder (a1) and contain photopolymerizable olefinically unsaturated groups and (a4) from 0 to 40% by weight of one or more assistants, by means of which the performance characteristics can be varied, with the proviso that the sum of the percentages stated under (a1) to (a4) is 100, (B) being a smooth or dull, nontacky release layer (B) which is transparent to light, soluble or swellable in the relevant liquid media and formed by a polymer forming strong films and the additives contained therein, and (C) being a cover sheet which can be detached from the release layer (B).

For the purposes of the present invention, the term "sheet-like" covers all three-dimensional shapes whose thickness is considerably smaller than their length and width, so that they are generally a tape-like or plate-like recording material.

Actinic light is understood in general as meaning light having a wavelength of from 230 to 450 nm.

Liquid media are to be understood as meaning liquids which mainly contain a solvent or a solvent mixture. In addition, these liquid media may in general contain additives, such as solid or liquid, organic and inorganic compounds. These media are used for development, ie. washing out the imagewise exposed relief-forming layer (A), and are therefore generally referred to as developer for short. In order for it to be possible to wash out a certain imagewise exposed relief-forming layer (A) with a certain developer, it is necessary in particular for the binder (a1) to be soluble or swellable in the relevant developer. The nature of the developer therefore also permits clear conclusions about the composition of the relief-forming layer (A).

The term compatible indicates that the relevant components in the relief-forming layer (A) can be distributed in molecular disperse form, causes no turbidity therein and furthermore does not separate in the course of time.

Here, photopolymerizable components (a3) containing olefinically unsaturated groups may be very generally separate compounds or may be groups which are bonded as pendant or terminal radicals for the polymeric binders (a1). Separate compounds are usually referred to as monomers, and groups bonded to binders are referred to below as photopolymerizable radicals.

Variation of the performance characteristics is to be understood as meaning the specific improvement of certain performance characteristics of photosensitive relief-forming layers (A) and of photopolymerized relief layers (A') produced therefrom. These improvements are evident in particular in the case of letter-press, gravure printing, flexographic printing and relief plates containing photopolymerized relief layers (A') and are generally achieved by adding conventional and known additives to the relief-forming layers (A). These additives are therefore often referred to as assistants. Multilayer, sheet-like, photosensitive recording elements of the stated type, whose release layer (B) contains additives in addition to the polymers forming strong films, are known.

For example, DE-A-24 56 439 discloses a recording material which contains, in its relief-forming layer (A), vinylaromatic/alkadiene block copolymers as binder (a1). The relief-forming layer (A) can be washed out with organic developers after the imagewise exposure. It is firmly bonded to a hard, nontacky, transparent, 0.5–20 µm thick polyamide or copolyamide film which is soluble in the developer. This film or this release layer (B) may contain small amounts, ie. <10% by weight, based on (B) of monomers, photopolymerization initiators and thermal polymerization inhibitors. A detachable protective or cover sheet (C) which can be removed from (B) without separating (B) from (A) may be present on top of this release layer (B).

A similar recording material is disclosed in DE-A-28 23 300. The use of polyurethanes for producing the release layer (B) is described therein.

A further similar recording material whose relief-forming layer (A) contains, as the binder (a1), polyalkadienes (natural rubber, polybutadiene), alkadiene/acrylonitrile copolymers (butadiene/acrylonitrile), vinylaromatic/alkadiene copolymers (styrene/butadiene), silicone rubbers, polysulfide rubbers, fluorine rubbers (vinylidene chloride/hexafluoropropylene copolymers), vinylaromatic/alkadiene block copolymers (styrene/isoprene, styrene/butadiene) or polyurethanes is disclosed in U.S. Pat. No. 3,990,897.

Furthermore, DE-B-21 23 702 discloses a recording material whose relief-forming layer (A) can be developed in an aqueous alkaline medium and which contains, as the binder (a1), polyamides, polyvinyl acetates or polymethyl methacrylates, and whose water-soluble release layer (B) consists of polyvinyl alcohol and an ethoxylated oleyl phosphate.

U.S. Pat. No. 4,072,527 discloses a recording material whose relief-forming layer (A) can be developed in an aqueous alkaline medium after imagewise exposure and contains, for example, methacrylic acid/methyl methacrylate copolymers as binder (a1).

The release layer (B) of this recording material is from 0.2 to 25 µm thick and contains a water-soluble polymer, such as partially hydrolyzed polyvinyl acetate, chloroacetate or propionate, and, finely dispersed therein, a water-insoluble polymer extracted from the group consisting of the (meth-)acrylate homo- and copolymers, from the group consisting of the vinylpyrrolidone/vinyl acetate copolymers or from the group consisting of the vinylidene chloride/alkyl acrylate/itaconic acid copolymers. The release layer (B) is prepared by casting from aqueous solution. To ensure that the casting solution is able satisfactorily to cover the surface of the relief-forming layer (A), an anionic or nonionic wetting agent, referred to there as a surfactant, should be present in a small amount in this case. Particularly suitable are sodium alkane sulfates and sulfonates of 12 to 18 carbon atoms, for example sodium dodecane sulfate or sodium octadecane sulfonate, or polyethylene glycols having an average molecular weight of less than 400, for example isooctylphenylpolyethoxyethanol having 9 or 10 ethoxy groups. The use of the fluorinated wetting agent

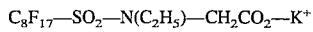

in an amount of 1% by weight, based on the total amount of the solids in the casting solution, is particularly preferred. The recording material of U.S. Pat. No. 4,072,525 is used in particular for the production of offset printing plates.

DE-A-37 36 980 describes release layers (B) which contain one or more compounds selected from the group consisting of the tertiary amines and amides and/or from the group consisting of the quarternary ammonium salts. With the aid of these additives, it is intended to reduce the electrostatic charge build-up on the plate surface after removal of the cover sheet (C).

The known multilayer, sheet-like, photosensitive recording materials which contain the layers (A), (B) and (C) have disadvantages which hinder, or even render impossible, the use of these recording materials for the production of high-quality letterpress, gravure printing, flexographic printing and relief plates which are particularly faithful to detail.

Thus, the removal of the cover sheet (C) from the release layer (B) in these recording materials results in a strong electrostatic charge build-up on the remaining layers (A) and (B). Said charge build-up causes deposition of dirt particles on the surface of the release layer (B), having a considerable adverse effect on the copying properties of the recording materials. Owing to the deposited dirt particles, the image masks or photographic negatives through which exposure is effected no longer in fact rest exactly on the recording materials, leading to poor resolution during exposure, to problems in the reproduction of shadow well depths and to side lighting due to scattered light, so that in general the image obtained is not crisp and does not meet very high quality requirements. This is particularly strongly evident in the production of photopolymerized letterpress, gravure printing and flexographic printing plates, in which, during printing, the dirt deposit finally leads to disadvantageous altered ink acceptance and inking, to edge damage and to reduced relief adhesion, which considerably shortens the life of these printing plates in the printing of continuous stationery.

Furthermore, the attempt described in DE-A-3736980 and aimed at reducing the charge build-up by means of antistatic additives, such as quarternary ammonium salts, has only an insignificant effect in practice.

All these methods are still insufficient for reducing the electrostatic charge build-up to such an extent that errors caused in practice by the electrostatic charge build-up are completely absent.

It is an object of the present invention to provide a novel multilayer, sheet-like, photosensitive recording material which no longer has the disadvantages of the known recording materials and which thus permits the production of high-quality, photopolymerized letterpress, gravure printing, flexographic printing and relief plates which are faithful to detail.

We have found that this object is achieved by a multilayer, sheet-like recording material which is suitable for the production of printing plates and contains the layers (A), (B) and (C) arranged one on top of the other, (A) being a photosensitive relief-forming layer in which imagewise exposure to actinic light results in a difference between the solubilities of the exposed and unexposed parts, so that the layer can be developed with organic, aqueous alcoholic, aqueous alkaline or aqueous liquid media, and this layer consisting of a mixture of:

(a1) from 20 to 98.999% by weight of one or more polymeric binders, (a2) from 0.001 to 10% by weight of one or more photopolymerization initiators, (a3) from 1 to 60% by weight of one or more organic compounds which are compatible with the binder (a1) and contain photopolymerizable olefinically unsaturated groups and (a4) from 0 to 40% by weight of one or more assistants, with the proviso that the sum of the percentages stated under (a1) to (a4) is 100, (B) being a smooth or dull, nontacky release layer (B) which is transparent to light, soluble or swellable in the relevant liquid media and formed by a polymer forming strong films and the additives contained therein, and (C) being a cover sheet which can be detached from the release layer (B), wherein the release layer (B) contains, as additives, from 0.001 to 20% by weight, based on its total amount, of one or more salts of the general formula $M_n X_m$, where M=an alkali metal, alkaline earth metal, aluminum, divalent manganese, copper, zinc, tin, trivalent titanium or chromium or divalent or trivalent iron, cobalt or nickel ion, X is a hydride, hydroxide, halide, sulfate, nitrite, nitrate, phosphate, acetylacetonate or trifluoromethanesulfonate ion and n and m are each 1, 2 or 3, depending on the valency of the particular opposite ion.

Where, in the general formula $M_n X_m$, M is an alkali metal or alkaline earth metal ion, Li, Na and K or Mg and Ca, are particularly suitable here.

The halides and acetylacetonates of trivalent metals, such as Al, Fe, Ni, Cr and Co, are particularly preferred.

The present invention also relates to a process for the production of letterpress, gravure printing, flexographic printing or relief plates, in which the novel recording materials are usually used in the form in which they are applied to a dimensionally stable substrate, with or without the use of an adhesion-promoting layer.

Examples of cations of the salts $M_n X_m$ to be used according to the invention are:

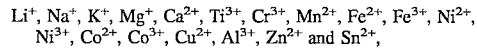

and examples of anions are H—, OH—, Cl—, Br—, I—, $SO_4^{2-}$, $NO^{3-}$, $NO_2^-$, $PO_4^{3-}$, acetylacetonate and $CF_3SO_3$—.

An essential component of the novel, multilayer, sheet-like, photosensitive recording material, abbreviated to novel recording material below, is the novel release layer (B).

The novel release layer (B) is from 0.5 to 25 µm thick, and covers, completely and in uniform thickness, the photosensitive relief-forming layer (A) present beneath it. It is transparent to light and thus does not interfere with the imagewise exposure of the relief-forming layer (A) to actinic light. It is soluble or at least swellable in the developers with which the imagewise exposed relief-forming layer (A) is washed out, so that it can be removed completely from the photopolymerized relief layer (A') during the development.

The novel release layer (B) contains from 80 to 99.999%, in particular from 85 to 99.5%, based on its total amount, of a polymer forming strong films. This polymer is advantageously one selected from the group consisting of the polyvinyl alcohol/alkane carboxylates having a degree of hydrolysis of from 30 to 99%, polyamides, copolyamides, polyurethanes, poly(meth)acrylates, cyclized rubbers having a high degree of cyclization, ethylene/propylene copolymers, homo- and copolymers of vinyl chloride and ethylene/vinyl acetate copolymers. Polymers of this type are generally known. The choice of the polymer for the production of the release layer (B) depends primarily on the solubility properties of the polymer on the one hand and of the relief-forming layer (A) to be covered therewith on the other hand. The solubilities, which are generally known, should be matched with one another in such a way that the two layers (A) and (B) can be washed out or washed away with one and the same developer.

If the release layer contains more than 99.999% of the polymer, its dirt-repelling action is markedly smaller.

According to the invention, the novel release layer (B) contains from 0.001 to 20, in particular from 0.5 to 15% by weight, based on its total amount, of one or more salts of the general formula $M_n X_m$ defined above.

The novel release layer (B) to be used according to the invention is usually produced during the production of the novel recording material.

A further essential component of the novel recording material is the photosensitive relief-forming layer (A), in which the imagewise exposure to actinic light results in a difference between the solubilities of the exposed and unexposed parts, so that the layer can be developed with aqueous or organic media.

The photosensitive relief-forming layer (A) contains from 20 to 98.999, preferably from 30 to 95, in particular from 40 to 90% by weight, based on its total amount, of one or more polymeric binders (a1).

Binders (a1) which are suitable according to the invention are from the polymer classes consisting of the polyamides, copolyamides, polyesters, polyurethanes, polyalkadienes, vinylaromatic/alkadiene copolymers and block copolymers, alkadiene/acrylonitrile copolymers, butyl rubbers, acrylate rubbers, polychloroprenes, fluorine rubbers, polysulfide rubbers, silicone rubbers, ethylene/propylene copolymers, chlorosulfonated polyethylenes or ethylene/(meth)acrylate, ethylene/vinyl acetate and ethylene/ (meth)acrylic acid copolymers or are selected for use from this group. These polymers suitable as binders (a1) are known compounds and are obtainable by conventional and known methods of polymer chemistry.

The photosensitive relief-forming layer (A) furthermore contains from 0.001 to 10, preferably from 0.1 to 7, advantageously from 0.2 to 5, in particular from 0.3 to 4% by weight of one or more photopolymerization initiators (photoinitiators) (a2), the amount thereof also being determined by the amount of components (a3) present.

Examples of suitable photoinitiators (a2) are benzoin or benzoin derivatives, such as the methyl, isopropyl, n-butyl or isobutyl ether thereof, symmetrically or asymmetrically substituted benzil acetal, such as benzil dimethyl acetal, or benzil 1-methyl 1-ethyl acetal; acylarylphosphine oxides, such as 2-dimethoxybenzoyldiphenylphosphine oxide or 2,4,6-trimethylbenzoyldiphenylphosphine oxide, ethyl 2,4,6-trimethylbenzoylphenylphosphinate or benzophenone or 4,4'-bis(dimethylamino)benzophenone. They may be used alone or as a mixture with one another or in combination with coinitiators, for example benzoin methyl ether with triphenylphosphine, diacylphosphine oxides with tertiary amines or acylarylphosphine oxides with benzil dimethyl acetal.

The photosensitive relief-forming layer (A) also contains from 1 to 60, preferably from 1.5 to 40, in particular from 2 to 30, particularly preferably from 2 to 15% by weight of one or more organic compounds (a3) which are compatible with the binder (a1) and contain photopolymerizable olefinically unsaturated groups.

These monomers (a3) generally have a boiling point of over 100° C. at atmospheric pressure and a molecular weight of up to 3000, in particular up to 2000. Examples of suitable monomers are the esters of acrylic acid and/or methacrylic acid with monohydric or polyhydric alcohols, such as butyl acrylate, butyl methacrylate, 2-ethylhexyl acrylate, lauryl (meth)acrylate, ethylene glycol di(meth)acrylate, butanediol 1,4-di(meth)acrylate, neopentylglycol di(meth)acrylate, 3-methylpentanediol di(meth)acrylate, 2-hydroxypropyl (meth)acrylate, 2-hydroxyethyl (meth)acrylate, hexanediol 1,6-di(meth)acrylate, 1,1,1-trimethylolpropane tri(meth)acrylate, di-, tri- and tetraethylene glycol di(meth)acrylate, tripropylene glycol di(meth)acrylate or pentaerythrityl tetra(meth)acrylate, the vinyl ester of aliphatic monocarboxylic acids, such as vinyl oleate, the vinyl ethers of alcohols, such as octadecyl vinyl ether and 1,4-butanediol divinyl ether, the diesters of fumaric and maleic acid or the reaction products of the OH— or $NH_2$-terminated, oligomeric polybutadienes with maleic acid or (meth) acrylic acid, ie. oligomeric polybutadienes having activated photopolymerizable olefinic double bonds.

The photosensitive relief-forming layer (A) may furthermore contain one or more assistants, with the aid of which the performance characteristics of the relief layer (A') can be varied.

These are in particular plasticizers, thermal polymerization inhibitors, crosslinking agents, antioxidants, antiozonants, fillers, lubricants or mold release agents. In general, their amount should not exceed 40% by weight of the total amount of the layer (A).

Examples of plasticizers are modified and unmodified natural oils and natural resins, such as paraffinic or naphthenic oils, and mineral oil resins or pentaerythrityl esters of hydrogenated rosin, esters of alkyl, alkenyl, arylalkyl or arylalkenyl alcohols of acids, such as ethylhexanoic acid, phthalic acid or stearic acid, synthetic oligomers or resins, such as oligostyrene, oligomeric styrene/butadiene copolymers, oligo-α-methylstyrene, oligomeric α-methylstyrene/p-methylstyrene copolymers and liquid 1,2- and 1,4-oligobutadienes. These may be present, for example, in amounts of from 1 to 40% by weight, based on the total amount of the layer (A).

Thermal polymerization inhibitors may be added in general in an amount of from 0.001 to 2% by weight, based on the total amount of the layer (A) and have no significant self-absorption in the actinic range in which the photoinitiator (a2) absorbs. Examples of suitable inhibitors are hydroquinone, α-methoxyphenol, 2,6-di-tert-butyl-p-cresol, β-naphthol, phenothiazine, pyridine, nitrobenzene and chloranil.

Examples of crosslinking agents are the conventional and known trifunctional and tetrafunctional thiol compounds.

Examples of antioxidants are sterically hindered monophenols, such as 2,6-di-tert-butyl-p-cresol, alkylated thiobis- and alkylidenebisphenols, such as 2,2'-methylenebis(4-methyl-6-tertbutylphenol), hydroxybenzyls, such as 1,3,5-trimethyl-2,4,6tris(3,5-di-tert-butyl-4-hydroxybenzyl)benzene, or phosphites, such as tris(nonylphenyl) phosphite. Amounts of from 0.0001 to 5% by weight, based on the layer (A) are advantageous.

Examples of polymeric or nonpolymeric organic and inorganic fillers or reinforcing fillers which cannot be admixed to give a molecular disperse mixture are those which are essentially transparent to the wavelengths of the light used for exposure of the novel mixtures, do not scatter this light and are substantially matched in their refractive index with the relevant mixture, examples being polystyrene and organophilic silica. These assistants are used in amounts which vary with the desired properties of the recording materials. The fillers have the advantage that they can improve the strength of the relief-forming layer (A) and of the relief layer (A') produced therefrom and the abrasion resistance thereof and can reduce the tack thereof.

An example of a lubricant is calcium stearate.

An example of a mold release agent is talc.

Examples of antiozonants are the conventional and known antiozonant waxes and chloroalkanes having 8 to 40 carbon atoms and from 30 to 73% by weight of chlorine in the molecule.

Photosensitive relief-forming layers (A) which contain the components (a1), (a2), (a3) and, if required, (a4) described above are to be developed with organic developers, for example hydrocarbon/alcohol mixtures (eg. Nylosolv® from BASF Aktiengesellschaft) or with aqueous solutions after the imagewise exposure to actinic light.

The thickness of the layers (A) depends primarily on the intended use of the novel recording materials; for example, thicknesses of from about 0.5 to 2.5 mm are used for printing flexible materials, and thicknesses of from about 3.5 to 7 mm for printing boxboard and corrugated boards.

A further essential component of the novel recording material is the cover sheet (C), which can be readily detached from the release layer (B). Examples of particularly advantageous cover sheets (C) are 20–150 μm thick, smooth or dull, biaxially oriented or unoriented plastics films which may have been treated to render it antiadhesive and comprises polyethylene, polypropylene, polyamide, polystyrene or a polyester, such as polyethylene terephthalate.

In addition to these essential components (A), (B) and (C), the novel recording materials may contain further layers which are useful for the function of the recording materials.

For example, the photosensitive relief-forming layer (A) may be bonded, firmly or readily detachably, to a dimensionally stable substrate (SU). Said substrate in turn may have a flexible and resilient lower layer (LL). Furthermore, a firm bond can be achieved between (SU) and (A) with the aid of an adhesion-promoting layer (APL).

The dimensionally stable substrates (SU) used may be sheets, films or conical or cylindrical sleeves of metals, such as steel, aluminum, copper or nickel, or of plastics, such as polyethylene terephthalate, polybutylene terephthalate, polyamide or polycarbonate. Woven fabrics and nonwovens, for example glass fiber fabrics or composite materials comprising, for example, glass fibers and plastics, such as polyethylene terephthalate, are also suitable.

Conventional and known, about 0.5–40 μm thick layers comprising a mixture of adhesive-forming components are advantageously used as adhesion-promoting layers (APL).

If highly reflective sheets or films are used as the substrate (SU), they may contain suitable antihalation agents, such as carbon black or manganese dioxide. However, the antihalation agents may also be applied as a separate layer on (SU) or may be present in the adhesion-promoting layer (APL) or in the relief-forming layer (A).

The preparation of the essential components (A), (B) and (C) of the novel recording material has no special technical features but is carried out by the conventional and known methods for the production of photosensitive layers and release layers and by the conventional and known methods for the production of plastics films, paper sheets and metal foils.

For example, the photosensitive relief-forming layers (A) and the release layers (B) can usually be produced by mixing the relevant components by means of the conventional kneading, mixing and dissolution methods, followed by shaping of the mixtures to sheet-like layers by casting from solution, hot pressing, calendering or extrusion. These operations are usually integrated in the process for the production of the novel recording materials.

The components of the cover sheets (C) are likewise mixed by the conventional kneading, mixing and dissolution methods and shaped into the corresponding sheets by casting from solution, hot pressing, calendering or extrusion and blow molding. These operations, too, can be integrated in the process for the production of the novel recording materials; usually, however, the top sheets (C) are produced separately, wound on rollers and used in this form for the production of the novel recording materials.

The production of the novel recording materials, too, has no special technical features, but is carried out in a conventional manner by the bonding of the relief-forming layer (A) to the release layer (B) and to the cover sheet (C), it also being possible to effect this on a dimensionally stable substrate (SU), with or without the use of an adhesion-promoting layer (APL) and of a flexible and resilient lower layer (LL). It is possible in principle here first to bond the relief-forming layer (A) to the substrate (SU) and then to cover the uncovered side of said layer with the release layer (B) and the cover sheet (C), or the relief-forming layer (A) is first applied to the cover sheet (C) covered with the release layer (B), and only thereafter bonded to the substrate (SU). These operations can of course be carried out in succession or simultaneously in conventional and known, continuous or batchwise apparatuses.

The novel recording materials are used for the production of photopolymerized letterpress, gravure printing, flexographic printing and relief plates.

The production of the photopolymerized printing plates from the novel recording materials comprises the following operations:

1. if required, pretreatment of the novel recording materials,
2. detachment of the cover sheet (C) from the release layer (B),
3. placing of an image mask or photographic negative on the release layer (B),
4. imagewise exposure of the photosensitive relief-forming layer (A) to actinic light having a wavelength of from 230 to 450 nm, in particular from 350 to 450 nm,
5. washing out (development) of the unexposed parts of the imagewise exposed relief-forming layer (A) by means of organic, aqueous alcoholic, aqueous alkaline or aqueous liquid media (developers), the release layer (B) also being washed away, and
6. drying and
7. if required, aftertreatment of the photopolymerized printing plates and relief plates obtained in this manner, which now contain or consist of a relief layer (A').

The novel release layer (B) to be used according to the invention prevents electrostatic charge build-up on the recording materials and the deposition of dirt particles and thus improves the copying properties of the novel recording materials, so that they considerably facilitate or actually permit the production of high-quality letterpress, gravure printing, flexographic and relief plates which are particularly faithful to detail.

In the examples and comparative examples which follow, the electric field strength generated with uniform stressing of the recording materials, in association with the relaxation time $t_{50}$ when the electric field strength reaches 50% of the original value, served as a measure of the electrostatic chargeability of the recording materials.

In order to measure the relaxation time $t_{50}$, the cover sheet (C) of the recording materials was first removed mechanically from the relevant release layers (B) (novel examples 1 to 4) or from the relevant known release layers (comparative experiments 1 to 4) under exactly comparable conditions, after which the resulting electric field strength (kV/m) and its decrease as a function of time were measured inductively by means of an electrostatometer by a non-contact method. The more rapid this decrease, the more advantageous is the relevant recording material.

The conventional and known screened or flat image masks or photographic negatives and the conventional exposure apparatuses were used for imagewise exposure of the photosensitive recording materials.

Commercial washers were used for the development of the exposed recording materials.

The recording materials were produced in a conventional and known manner by extrusion of the components of the relief-forming layers (A) from a twin-screw extruder, discharge of the mixtures from a slot die and bonding of the resulting photosensitive layers (A) to dimensionally stable substrates (SU) and cover sheets (C), which have release layers (B) on the side facing the relief-forming layers (A), by means of calendering.

The novel and the known release layers were produced on the cover sheets (C) by Casting from solutions.

The production and further processing of the recording materials were carried out in unpurified air.

The quality of the relief layers was assessed visually under a microscope and rated as follows:

| | |
|---|---|
| excellent | (defect-free relief, all image elements are completely satisfactorily reproduced, there is no undercutting of the relief walls or edge damage, scratches are not present) |
| good | (substantially defect-free relief, there is no undercutting of the relief walls or edge damage, the very fine image elements are upright but not of optimum quality, a few scratches are present) |
| poor | (defective relief in places, not all very fine image elements are faithful to detail and are reproduced with certain distortion, increased undercutting of the relief walls or edge damage is observed, there is a larger number of scratches). |

The printing tests were carried out on conventional letterpress and flexographic printing units, the printing inks usually used for the corresponding printing methods being employed. The achievable run of excellent prints was a measure of the print quality.

In the examples and comparative examples which follow, parts and percentages are by weight, unless stated otherwise.

Examples 1 and 2 and comparative examples 1 and 2
Experimental method:

Photosensitive mixtures as typically used for photosensitive relief-forming layers (A) in flexographic printing plates and letterpress plates were first prepared for the examples and the comparative examples.

These mixtures were shaped on substrates (SU) to give photosensitive relief-forming layers (A). The substrates (SU) used were 125 μm thick polyethylene terephthalate films which had a 0.5 μm thick polyurethane adhesive-forming layer on the side facing the relief-forming layer (A). The thickness of the particular relief-forming layer (A) depended primarily on the intended use and was 3 mm in the case of the flexographic printing plates and 0.8 mm in the case of the letterpress plates.

The relief-forming layers (A) were covered with the novel release layers (B) (examples) or with prior art release layers (comparative examples) and with 125 μm thick polyethylene terephthalate films (C) which were dull on one side ($R_{max}$=5 μm).

Table 1 gives an overview of the composition of the relief-forming layers (A), of the novel release layers (B) and of the prior art release layers.

After the production of these novel and known recording materials, their electrostatic chargeability was determined separately using samples taken from the recording materials.

The results of these measurements are summarized in Table 2.

Furthermore, after the cover sheets (C) had been removed, the recorded materials were exposed imagewise, developed, dried, aftertreating in a conventional manner by exposure to UVC light in the case of the photopolymerized flexographic printing plates of Examples 1a and 1b and of Comparative Examples 1Va to 1Vc, clamped on printing cylinders and used for the printing of continuous stationery.

Here, printing plates from Examples 1a and 1b and from Comparative Examples 1Va to 1Vc were developed by means of the commercial organic developer ®Nylosolv, and printing plates from Examples 2a and 2b and from Comparative Examples 2Va to 2Vc were developed by means of aqueous alkaline developers (1% strength sodium hydroxide solution).

The results of the visual assessment of the quality of the relief layers (A') and the results of the printing tests are likewise shown in Table 2.

Comparison of all these test results shows that the novel recording materials have a considerably smaller electrostatic charge build-up than the known recording materials and that they give better photopolymerized printing plates and longer runs of excellent prints than the known recording materials.

In Table 1, the abbreviations used and the short names in inverted commas have the following meanings:

| | |
|---|---|
| "Block copolymer" | SIS rubber from Shell, ® Cariflex TR 1107; |
| HDA2 | hexanediol 1,6-diacrylate; |
| "Initiator" | benzil dimethyl ketal; |
| "Chloroalkane" | chloroparaffin having a chlorine content of 49% and a density of 1.24 g/cm³; |
| "Oligomer" | oligomer of 70% by weight of p-methylstyrene and 30% by weight of α-methylstyrene; |
| "Stabilizer" | 2,6-di-tert-butyl-p-cresol |
| "Terpolymer" | terpolymer which was prepared by polymerization of a mixture of 57% by weight of ethylene, 15% by weight of acrylic acid and 28% by weight of 2-ethylhexyl acrylate; |
| TEGA2 | tetraethylene glycol diacrylate |
| "Polyamide" | commercial polyamide from Henkel AG, ® Macromelt; |
| PVA | commercial polyvinyl alcohol from Hoechst AG, Mowiol ® 498 |
| "Amine" | N,N-bis(2-hydroxyethyl)-N-stearylamine |
| "Ammonium salt" | N-methyl-N,N-bis(2-hydroxyethyl)-N-stearyl-ammonium ethylsulfate |
| "Phosphoric ester" | ethoxylated oleyl phosphate |
| "Metal salt I" | chromium(III) chloride; |
| "Metal salt II" | aluminum(III) chloride; |
| "Metal salt III" | chromium(III) acetylacetonate; |
| "Metal salt IV" | iron(III) chloride. |

The components "amine" and "ammonium salt" of Comparative Examples 1Va as well as 2Va and 2Vb originate from the examples of DE-A-37 36 980.

TABLE 1

Examples 1 and 2 and Comparative Examples 1V and 2V; composition of novel recording materials and prior art recording materials (Va to Vc)

| Ex. No. | Composition of the photosensitive relief-forming layer (A) | | Composition of the release layer (B) | | | | |
|---|---|---|---|---|---|---|---|
| | | | a | b | Va | Vb | Vc |
| 1 | 81.2% by weight | "Block copolymer" | "Polyamide" (99.5% by weight) | "Polyamide" (99% by weight) | "Polyamide" (90% by weight) | "Polyamide" (97% by weight) | "Polyamide" (95% by weight) |
| | 7% by weight | | "Metal salt I" (0.5% by weight) | "Metal salt II" (1% by weight) | "Amine" (10% by weight) | "Ammonium salt" (3% by weight) | "Phosphoric ester" (5% by weight) |
| | 1.3% by weight | HDA2 | | | | | |
| | 5% by weight | "Initiator" | | | | | |
| | 5% by weight | "Oligomer" | | | | | |
| | 0.5% by weight | "Chloroalkane" "Stabilizer" | | | | | |
| 2 | 93.5% by weight | "Terpolymer" | PVA (99% by weight) | PVA (97% by weight) | PVA (85% by weight) | PVA (90% by weight) | PVA (95% by weight) |
| | 5% by weight | TEGA2 | "Metal salt III" (1% by weight) | "Metal salt IV" (3% by weight) | "Amine" (15% by weight) | "Ammonium salt" (10% by weight) | "Phosphoric ester" (5% by weight) |
| | 0.5% by weight | "Initiator" | | | | | |
| | 1% by weight | "Stabilizer" | | | | | |

TABLE 2

Electrostatic chargeability of the recording materials from Table 1 and the relevant performance characteristics of the photopolymerized printing plates produced therefrom

| No. | Field strength [kV/m] | $t_{50}$ [min] | Quality of the relief layer (A') Rating | Achievable run of excellent prints in printing of continuous stationery | Remarks |
|---|---|---|---|---|---|
| 1a | 3 | 0.5 | excellent | >50000 | The printing tests were terminated because no loss of quality occurred |
| 1b | 5 | 0.3 | excellent | >50000 | |
| 1Va | 8 | 20 | poor | 10000 | Gradual loss of quality |
| 1Vb | 6 | 15 | good | 10000 | Gradual loss of quality |
| 1Vc | 12 | 18 | poor | no excellent prints obtainable | |
| 2a | 3 | 0.4 | excellent | >50000 | The printing tests were terminated because no loss of quality occurred |
| 2b | 2 | 0.7 | excellent | >50000 | The printing tests were terminated because no loss of quality occurred |
| 2Va | 6 | 8 | poor | 20000 | Gradual loss of quality |
| 2Vb | 5 | 7.5 | poor | 15000 | Gradual loss of quality |
| 2Vc | 10 | 15 | poor | 10000 | Gradual loss of quality |

We claim:

1. A multilayer, sheet-like recording material which is suitable for the production of printing plates and contains the layers (A), (B) and (C) arranged one on top of the other, (A) being a photosensitive relief-forming layer in which imagewise exposure to actinic light results in a difference between the solubilities of the exposed and unexposed parts, so that the layer can be developed with organic, aqueous alcoholic, aqueous alkaline or aqueous liquid media, and this layer consisting of a mixture of:

(a1) from 20 to 98.999% by weight of one or more polymeric binders, (a2) from 0.001 to 10% by weight of one or more photopolymerization initiators, (a3) from 1 to 60% by weight of one or more organic compounds which are compatible with the binder (a1) and contain photopolymerizable olefinically unsaturated groups and (a4) from 0 to 40% by weight of one or more assistants, with the proviso that the sum of the percentages stated under (a1) to (a4) is 100, (B) being a smooth or dull, nontacky release layer (B) which is transparent to light, soluble or swellable in the liquid developed media and formed by a film forming polymer and the additives contained therein, and (C) being a cover sheet which can be detached from the release layer (B), wherein the release layer (B) contains, as additives, from 0.001 to 20% by weight, based on its total amount, of one or more salts of the general formula $M_n X_m$, where M=an alkali metal, alkaline earth metal, aluminum, divalent manganese, copper, zinc, tin, trivalent titanium or chromium or divalent or trivalent iron, cobalt or nickel ion, X is a hydride, hydroxide, halide, sulfate, nitrite, nitrate, phosphate, acetylacetonate or trifluoromethanesulfonate ion and n and m are each 1, 2 or 3, depending on the valency of the particular opposite ion.

2. A recording material as defined in claim 1, wherein, in the formula $M_n X_m$, M is Li, Na, K, Mg, Cr or Ca.

3. A recording material as defined in claim 1, wherein halides or acetylacetonates of trivalent metals are used as salts of the formula $M_n X_m$.

4. A process for the production of a letterpress, gravure printing, flexographic printing or relief plate from a sheet-like recording material containing the layers (A), (B) and (C) arranged one on top of the other (A) being a photosensitive relief-forming layer in which imagewise exposure to actinic light results in a difference between the solubilities of the exposed and unexposed parts, so that the layer can be developed with organic, aqueous alcoholic,. aqueous alkaline or aqueous liquid media, and this layer consisting of a mixture of:

(a1) from 20 to 98.999% by weight of one or more polymeric binders, (a2) from 0.001 to 10% by weight of one or more photopolymerization initiators, (a3) from 1 to 60% by weight of one or more organic compounds which are compatible with the binder (a1) and contain photopolymerizable olefinically unsaturated groups and (a4) from 0 to 40% by weight of one or more assistants, with the proviso that the sum of the percentages stated under (a1) to (a4) is 100, (B) being a smooth or dull, nontacky release layer (B) which is transparent to light, soluble or swellable in the liquid developer media and formed by a film-forming polymer and the additives contained therein, and (C) being a cover sheet which can be detached from the release layer (B), wherein the release layer (B) contains, as additives, from 0.001 to 20% by weight, based on its total amount, of one or more salts of the general formula $M_n X_m$, where M=an alkali metal, alkaline earth metal, aluminum, divalent manganese, copper, zinc, tin, trivalent titanium or chromium or divalent or trivalent iron, cobalt or nickel ion, X is a hydride, hydroxide, halide, sulfate, nitrite, nitrate, phosphate, acetylacetonate or trifluoromethanesulfonate ion and n and m are each 1, 2 or 3, depending on the valency of the particular opposite ion, which process comprises: detaching the cover sheet (C) from the release layer (B), placing an image mask or photographic negative on the release layer (B), imagewise exposing the photosensitive relief-forming layer (A) to actinic light having a wavelength of from 230 to 450 nm, washing out (development) of the unexposed parts of the imagewise exposed relief-forming layer (A) by means of organic, aqueous alcoholic, aqueous alkaline or aqueous liquid media (developers), the release layer (B) also being washed away, and drying and optionally aftertreating the photopolymerized printing plates and relief plates obtained in this manner, which now contain or consist of a relief layer (A').

* * * * *

UNITED STATES PATENT AND TRADEMARK OFFICE
CERTIFICATE OF CORRECTION

PATENT NO.: 5,593,811

DATED: January 14, 1997

INVENTOR(S): LOERZER et al.

It is certified that error appears in the above-identified patent and that said Letters Patent is hereby corrected as shown below:

On the cover page, item [57], after "ABSTRACT" insert the following:

--A multilayer, sheet-like recording material which is suitable for the production of printing plates and contains the layers (A), (B) and (C) arranged one on top of the other,--

On the cover page, item [73], "Munich" should be --Muenster--.

Column 12, claim 1, line 52, "developed" should be --developer--; and "film forming" should be --film-forming--.

Signed and Sealed this

Fourth Day of March, 1997

BRUCE LEHMAN

*Attest:*

*Attesting Officer*     *Commissioner of Patents and Trademarks*